(12) United States Patent
Edmunds

(10) Patent No.: US 8,196,572 B1
(45) Date of Patent: Jun. 12, 2012

(54) SOLAR PANEL CONE WITH ROTATING MIRROR

(76) Inventor: David Edmunds, Mt. Pleasant, SC (US)

( * ) Notice: Subject to any disclaimer, the term of this patent is extended or adjusted under 35 U.S.C. 154(b) by 484 days.

(21) Appl. No.: 12/468,997

(22) Filed: May 20, 2009

(51) Int. Cl.
*F24J 2/38* (2006.01)
*F24J 2/50* (2006.01)
*H02N 6/00* (2006.01)

(52) U.S. Cl. ......... 126/600; 126/573; 126/652; 136/246
(58) Field of Classification Search .................. 126/573, 126/600, 652; 136/246
See application file for complete search history.

(56) References Cited

U.S. PATENT DOCUMENTS

| 3,899,672 A | 8/1975 | Levi-Setti |
| 4,091,799 A | 5/1978 | Steiner |
| 4,248,643 A | 2/1981 | Peters |
| 4,266,530 A * | 5/1981 | Steadman ...................... 126/602 |
| 4,356,813 A | 11/1982 | Hoffman et al. |
| 5,882,434 A * | 3/1999 | Horne ........................... 136/246 |
| 6,396,167 B1 * | 5/2002 | Simburger et al. ............. 307/43 |
| 6,960,717 B2 | 11/2005 | Stuart et al. |
| D517,981 S | 3/2006 | Daly |
| 2010/0236604 A1 * | 9/2010 | Depaoli ........................ 136/246 |

\* cited by examiner

*Primary Examiner* — Kenneth Rinehart
*Assistant Examiner* — William Corboy
(74) *Attorney, Agent, or Firm* — Kyle Fletcher

(57) ABSTRACT

The solar panel cone with rotating mirror includes a cone-shaped solar panel array that rests upon a base, and a rotating mirror. The rotating mirror rotates about the base via a series of gears and motor. The device includes an electrical converter that is wired to the motor and an electrical wire that supplies electricity.

16 Claims, 4 Drawing Sheets

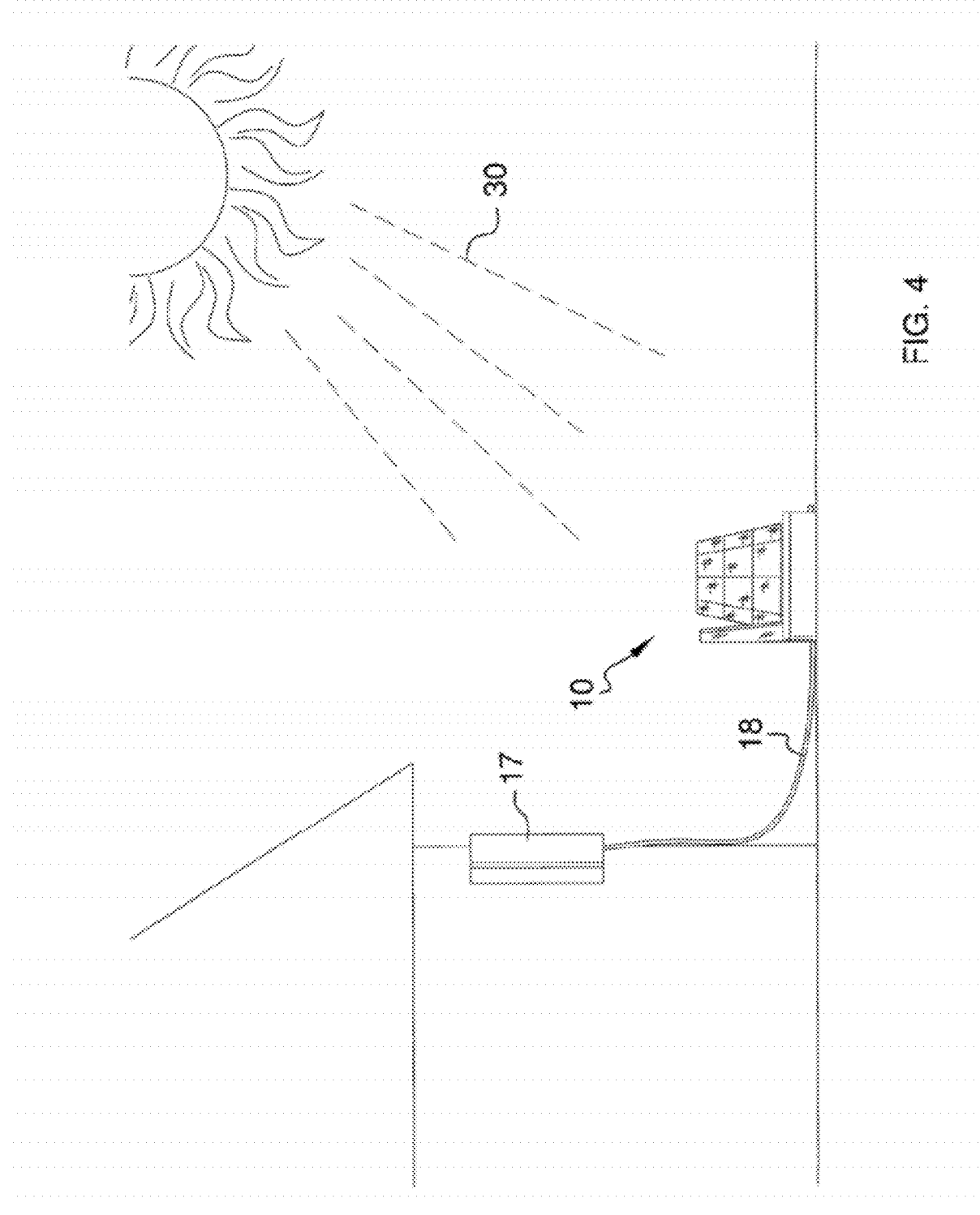

SOLAR PANEL CONE WITH ROTATING MIRROR

CROSS REFERENCES TO RELATED APPLICATIONS

Not Applicable

STATEMENT REGARDING FEDERALLY SPONSORED RESEARCH

Not Applicable

REFERENCE TO APPENDIX

Not Applicable

BACKGROUND OF THE INVENTION

A. Field of the Invention

The invention relates to the field of solar panels, more specifically, a solar panel cone that has a rotating mirror.

B. Discussion of the Prior Art

As a preliminary note, it should be stated that there is an ample amount of prior art that deals with solar panel systems. As will be discussed immediately below, no prior art discloses a solar panel system that includes a solar panel cone and a rotating mirror that reflects light around to an opposing side of the solar cone in order to maximize electrical generation efficiency.

The Levi-Setti Patent (U.S. Pat. No. 3,899,672) discloses a solar energy collection apparatus that has a cone or spherical shape. However, the solar energy collection apparatus does not include a rotating mirror that rotates to a side opposite the normally be located in the shadow of the solar panel.

The Steiner Patent (U.S. Pat. No. 4,091,799) discloses an automatically adjustable solar panel that will adjust it's angle to optimize the amount of sun reflected onto the surface. However, the solar panel does not resemble a cone and have a rotating mirror to reflect light around to the rear of the sun panel.

The Stuart et al. Patent (U.S. Pat. No. 6,960,717) discloses a solar panel that has an adjustable and pivoting joint to allow it to be rotated and always facing the sun for optimal solar collection. However, the solar' panel does not resemble a cone and also does not have a rotating mirror.

The Hoffman et al. Patent (U.S. Pat. No. 4,356,813) discloses a solar energy collection and concentrating device in which the collector is in the shape of a sphere with multiple panels located on it which all concentrate the light through the cone shaped mirrors. However, the mirrors are located on the cone and do not involve a rotating mirror that rotates about the base of a solar panel cone.

The Peters Patent (U.S. Pat. No. 4,248,643) discloses a device for collecting solar energy, converting said energy into electricity, and storing said electricity for later use. However, the device does not include a solar panel cone array with rotating mirror that maximized the overall efficiency of the solar panel cone by reflecting light around to the side of the cone that would otherwise be located in the shadow of the cone.

While the above-described devices fulfill their respective and particular objects and requirements, they do not describe a solar panel cone with rotating mirror. In this regard, the solar panel cone with rotating mirror departs from the conventional concepts and designs of the prior art.

SUMMARY OF THE INVENTION

The solar panel cone with rotating mirror includes a cone-shaped solar panel that rests upon a base, and a rotating mirror. The rotating mirror rotates about the base via a series of gears and motor. The device includes an electrical converter that is wired to the motor and an electrical wire that supplies electricity.

An object of the invention is to provide a solar panel cone with rotating mirror that increases the overall efficiency of the solar panel arrays by reflecting sunlight around to the solar panels located in the shadow of the cone.

A further object of the invention is to provide a solar panel cone with rotating mirror that can plug into any electrical outlet and supply electricity to the accompanying electrical grid.

These together with additional objects, features and advantages of the solar panel cone with rotating mirror will be readily apparent to those of ordinary skill in the art upon reading the following detailed description of presently preferred, but nonetheless illustrative, embodiments of the solar panel cone with rotating mirror when taken in conjunction with the accompanying drawings.

In this respect, before explaining the current embodiments of the solar panel cone with rotating mirror in detail, it is to be understood that the solar panel cone with rotating mirror is not limited in its applications to the details of construction and arrangements of the components set forth in the following description or illustration. Those skilled in the art will appreciate that the concept of this disclosure may be readily utilized as a basis for the design of other structures, methods, and systems for carrying out the several purposes of the solar panel cone with rotating mirror. It is therefore important that the claims be regarded as including such equivalent construction insofar as they do not depart from the spirit and scope of the solar panel cone with rotating mirror. It is also to be understood that the phraseology and terminology employed herein are for purposes of description and should not be regarded as limiting.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention:

In the drawings:

FIG. 4 illustrates a side view of the invention in use.

DETAILED DESCRIPTION OF THE EMBODIMENT

Figure 1:
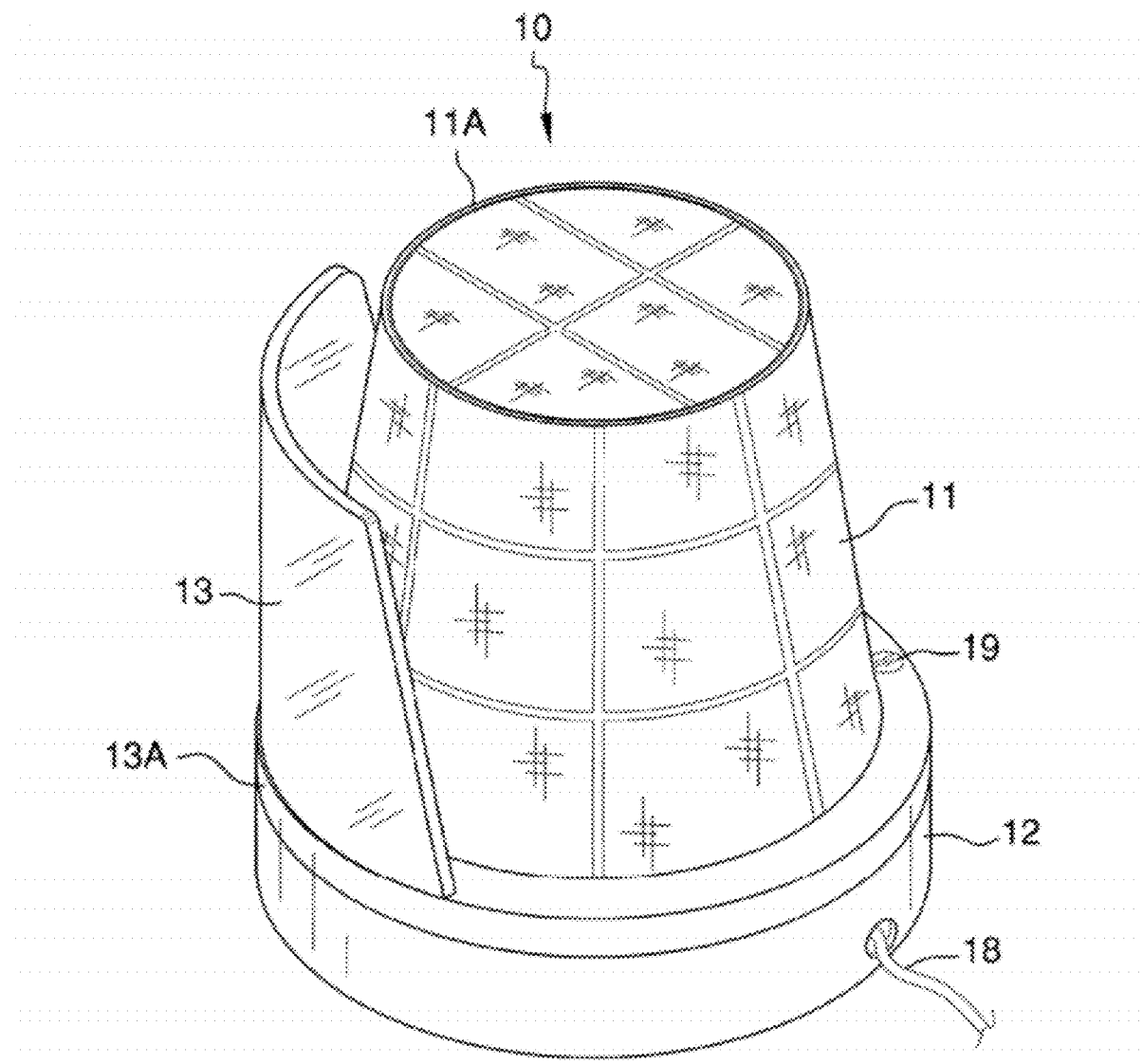
FIG. 1 illustrates a front, isometric view of the solar panel cone with rotating mirror.
Figure 2:
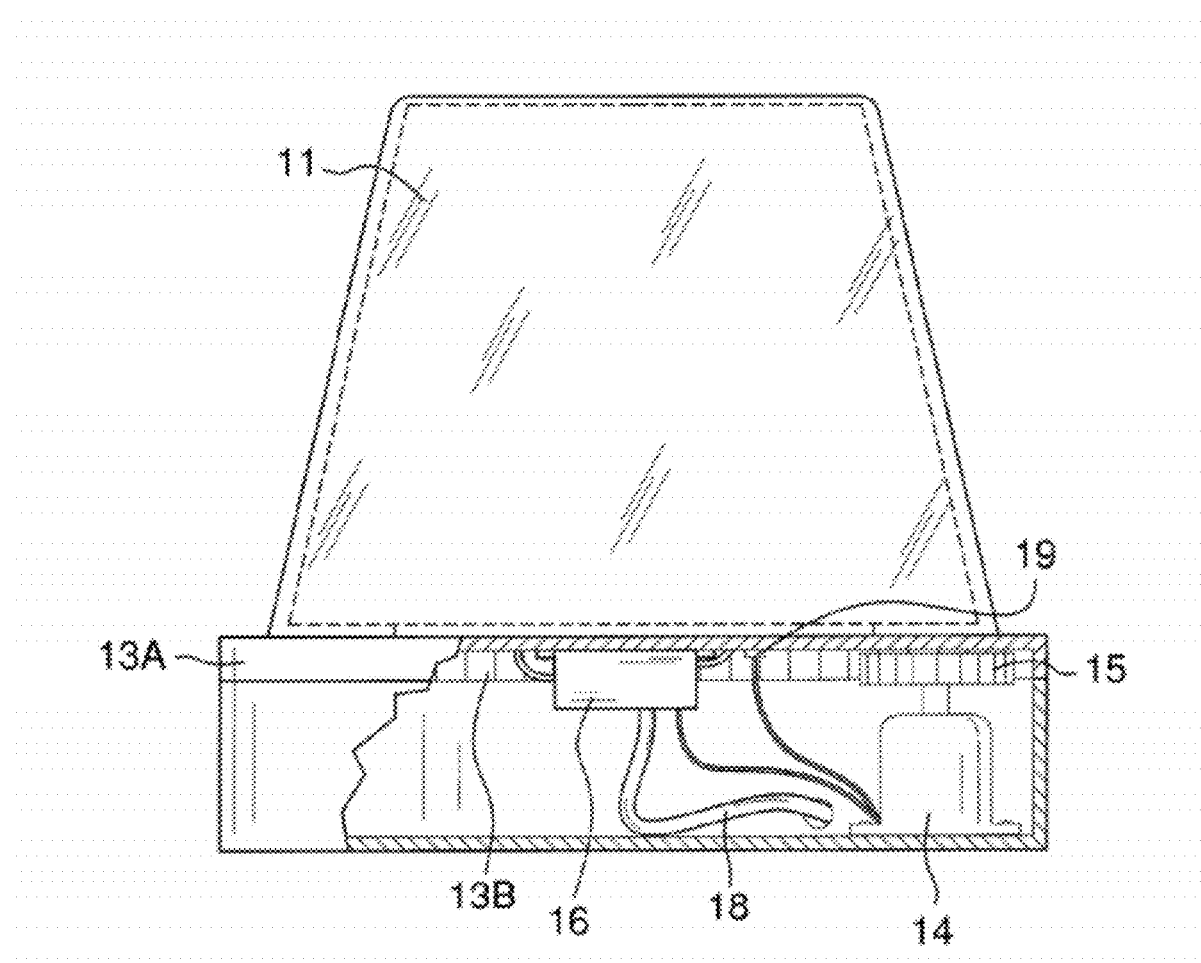
FIG. 2 illustrates a side, cut-away view of the solar panel cone detailing the converter, gears, motor, and electrical supply wire.
Figure 3:
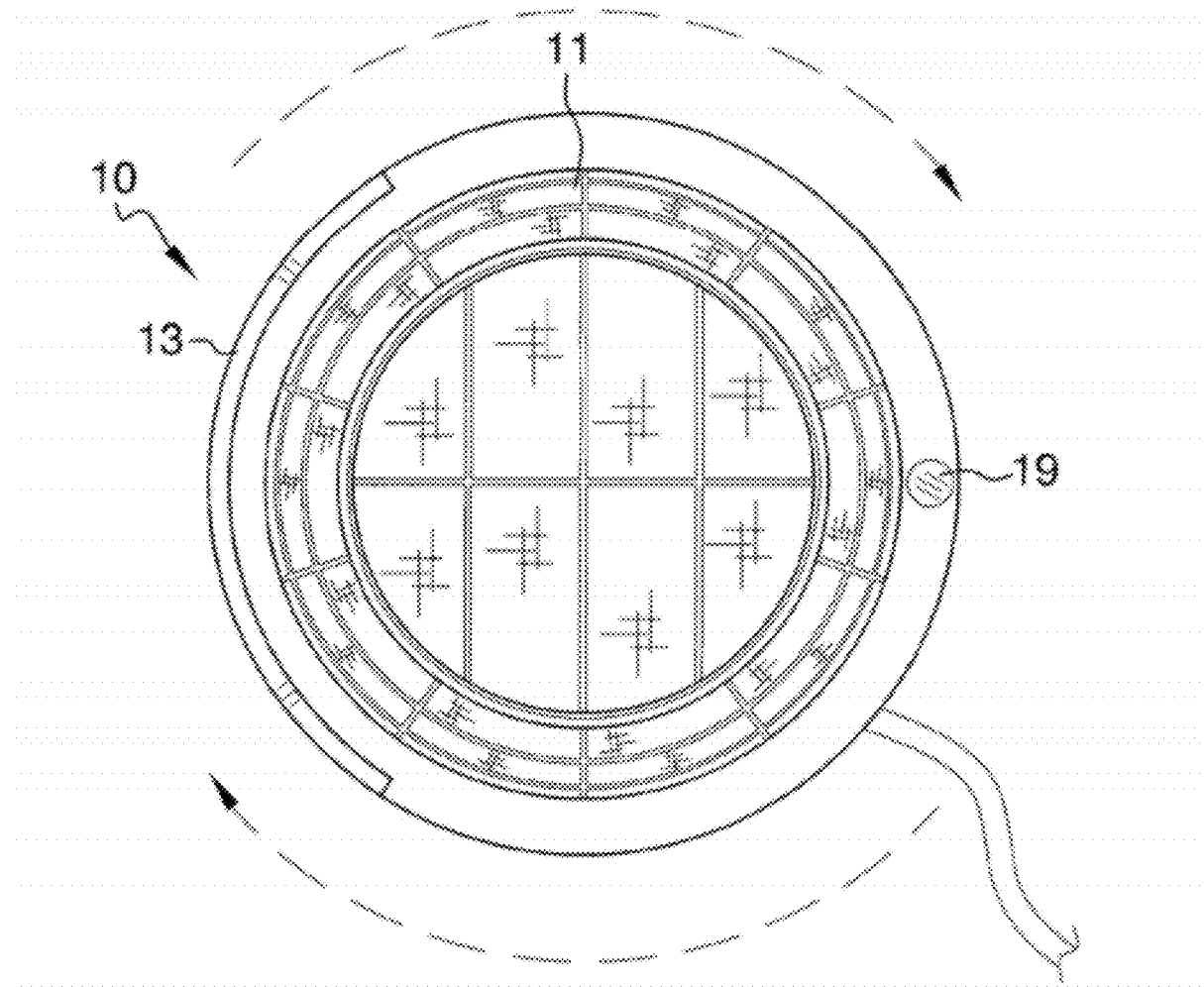
FIG. 3 illustrates a top view of the solar panel cone with arrows indicating movement of the rotating mirror.

Detailed reference will now be made to a main embodiment of the present invention, examples of which are illustrated in FIGS. 1-4. A solar panel cone with rotating mirror 10 (hereinafter invention) includes a solar panel cone 11, base 12, rotating mirror 13, motor 14, gears 15, converter 16, electrical supply line 18, and light sensor 19.

As a preliminary note, it shall be noted that the solar panel cone 11 as depicted depicts an up-side-down bucket having a generally concave shape along the sides. The solar panel cone 11 also has a top, flat surface 11A that is adorned with solar panels. However, it should be noted that the overall shape of the solar panel cone 11 may be semi-spherical in either overall shape or the top flat surface 11A. Also, the solar panel cone 11 may exclude the top, flat surface 11A, and simply come to a point. Nonetheless, a plurality of geometric shapes can be conceived and are rendered obvious in this disclosure.

The rotating mirror 13 has a top base 13A that aligns with the base 12 and is free to rotate about the base 12. Located inside of the base 12 is the motor 14 and gears 15. The rotating mirror 13 has a large gear 13B integrated into the inner, bottom surface of the top base 13A. The motor 14 is attached to the gear 15, which rotates the large gear 13B. Thus, as the motor 14 rotates, the gear 15 rotates the large gear 13B, which in turn results in the rotating mirror 13 rotating about the base 12.

The solar panel cone 11 can either be affixed to the base 12 or affixed to the rotating mirror 13. In the event that the solar panel cone 11 is affixed to the base 12, the rotating mirror will also rotate about the solar panel cone 11.

The motor 14 is operated by the light sensor 19, which is constantly tracking the movement of sunlight 30. As the light sensor 19 detects movement of the sunlight 30, a pre-determined amount of electricity is transmitted to the motor 14 in order for the rotating mirror 13 to be in proper alignment with respect to the solar panel cone 11 and the sunlight 30.

It shall be noted that the invention 10 depicts a single light sensor 19. However, it should be noted that multiple light sensors 19 may be employed. It hall be further noted that the position of the light sensor 19 is opposite the rotating mirror rotating mirror 13 is located in the shadow of the solar panel cone 11.

The invention 10 is simply used by placing the invention 10 in an open area that receives sunlight 30. Next, the light sensor 19 detects and tracks movement of the sunlight 30, and operates the motor 14 accordingly. As sunlight 30 is transferred into electricity via the solar panel cone 11, electricity is converted into the proper voltage via the converter 16. The electrical supply line 18 in turn transmits the output of the converter 16, and sends it to an electrical box 17 where the electricity is supplied to a neighboring structure or whatever electrical use is required.

With respect to the above description, it is to be realized that the optimum dimensional relationship for the various components of the invention 10, to include variations in size, materials, shape, form, function, and the manner of operation, assembly and use, are deemed readily apparent and obvious to one skilled in the art, and all equivalent relationships to those illustrated in the drawings and described in the specification are intended to be encompassed by the invention 10.

It shall be noted that those skilled in the art will readily recognize numerous adaptations and modifications which can be made to the various embodiments of the present invention which will result in an improved invention, yet all of which will fall within the spirit and scope of the present invention as defined in the following claims. Accordingly, the invention is to be limited only by the scope of the following claims and their equivalents.

The inventor claims:

1. A solar panel cone with rotating mirror comprising:
   (a) a solar panel array;
      wherein the solar panel array has a circular cross-section about a first plane;
   (b) a rotating mirror;
      wherein the rotating mirror is capable of rotating about the solar panel array via a driving means;
   (c) a light sensor;
      wherein the light sensor is diametrically opposite of the rotating mirror in that as the light sensor tracks the position of sunlight, the rotating mirror is in the shadow of the solar panel array;
      wherein the rotating mirror has a shape that contours to the circular cross-section of the solar panel array such that light is directed to the solar panel along a portion of the solar panel that is not in direct sunlight;
   (d) the driving means;
      wherein the driving means is controlled by the light sensor; and
      wherein the driving means is powered by electricity generated from the solar panel array.

2. The solar panel cone as described in claim 1 wherein the driving means comprises a motor and two gears that rotate the rotating mirror about the solar panel array.

3. The solar panel cone as described in claim 1 wherein a converter converts electricity generated from the solar panel array into a voltage that is supplied via an electrical supply wire.

4. The solar panel cone as described in claim 1 wherein the solar panel array resembles a cone having a top, flat surface.

5. The solar panel cone as described in claim 1 wherein the solar panel array resembles a cone.

6. The solar panel cone as described in claim 1 wherein the solar panel array resembles a cone having a semi-sphere along a top.

7. The solar panel cone as described in claim 1 wherein the solar panel array resembles a semi-sphere.

8. A solar panel cone with rotating mirror comprising:
   (a) a solar panel array;
      wherein the solar panel array has a circular cross-section about a first plane;
   (b) a rotating mirror;
      wherein the rotating mirror is capable of rotating about the solar panel array via a driving means;
   (c) a base;
      wherein the rotating mirror has a top base that rests upon a top opening of the base;
      wherein the rotating mirror rotates about the base
   (d) a light sensor;
      wherein the light sensor is diametrically opposite of the rotating mirror in that as the light sensor tracks the position of sunlight, the rotating mirror is in the shadow of the solar panel array;
      wherein the rotating mirror has a shape that contours to the circular cross-section of the solar panel array such that light is directed to the solar panel along a portion of the solar panel that is not in direct sunlight;
   (e) the driving means;
      wherein the driving means is located between the base and a bottom side of the top base of the rotating mirror;
      wherein the driving means is controlled by the light sensor; and
      wherein the driving means is powered by electricity generated from the solar panel array.

9. The solar panel cone as described in claim 8 wherein the driving means comprises a motor and two gears that rotate the rotating mirror about the solar panel array.

10. The solar panel cone as described in claim 8 wherein a converter converts electricity generated from the solar panel array into a voltage that is supplied via an electrical supply wire.

11. The solar panel cone as described in claim 8 wherein the solar panel array resembles a cone having a top, flat surface.

12. The solar panel cone as described in claim 8 wherein the solar panel array resembles a cone.

13. The solar panel cone as described in claim 8 wherein the solar panel array resembles a cone having a semi-sphere along a top.

14. The solar panel cone as described in claim 8 wherein the solar panel array resembles a semi-sphere.

15. A solar panel cone with rotating mirror comprising:
- a solar panel array having a circular cross-section about a first plane;
- a rotating mirror is capable of rotating about the solar panel array via a driving means;
- wherein the rotating mirror has a top base that rests upon a top opening of a base;
- wherein the rotating mirror rotates about the base;
- a light sensor is diametrically opposite of the rotating mirror in that as the light sensor tracks the position of sunlight, the rotating mirror is in the shadow of the solar panel array;
- wherein the rotating mirror has a shape that contours to the circular cross-section of the solar panel array such that light is directed to the solar panel along a portion of the solar panel that is not in direct sunlight;
- wherein the driving means is located between the base and a bottom side of the top base of the rotating mirror;
- wherein the driving means is controlled by the light sensor;
- wherein the driving means is powered by electricity generated from the solar panel array;
- wherein the driving means comprises a motor and two gears that rotate the rotating mirror about the solar panel array;
- wherein a converter converts electricity generated from the solar panel array into a voltage that is supplied via an electrical supply wire.

16. The solar panel cone as described in claim 15 wherein the solar panel array has a shape comprising a cone having a top, flat surface, a cone, a cone having a semi-sphere along a top, and a semi-sphere.

\* \* \* \* \*